United States Patent [19]

Miyagawa et al.

[11] 4,305,009
[45] Dec. 8, 1981

[54] LOW POWER CONSUMPTION HIGH SPEED TRANSISTOR CIRCUIT COMPRISING A COMPLEMENTARY CIRCUIT

[75] Inventors: Yoichi Miyagawa; Jiro Shimada; Hiroshi Iguchi, all of Tokyo, Japan

[73] Assignee: Nippon Electric Co., Ltd., Tokyo, Japan

[21] Appl. No.: 58,603

[22] Filed: Jul. 18, 1979

[30] Foreign Application Priority Data

Jul. 20, 1978 [JP] Japan ................................ 53-88965

[51] Int. Cl.³ .................... H03K 17/04; H03K 17/687
[52] U.S. Cl. ............................... 307/264; 307/279; 307/585; 307/DIG. 1
[58] Field of Search ............... 307/251, 264, 279, 288, 307/313, DIG. 1, 585

[56] References Cited

U.S. PATENT DOCUMENTS

| | | | |
|---|---|---|---|
| 3,631,528 | 12/1971 | Green | 307/313 X |
| 4,039,862 | 8/1977 | Dingwall et al. | 307/DIG. 1 |
| 4,045,691 | 8/1977 | Asano | 307/264 |

*Primary Examiner*—Eugene R. LaRoche
*Attorney, Agent, or Firm*—Laff, Whitesel, Conte & Saret

[57] ABSTRACT

A low-power consumption, high-speed electronic switching system has a pair of complementary switching means connected between opposite polarity terminals of the voltage source and an output terminal. The pair of switches provides a variable impedance for applying one or the other of the polarities and said output terminal. To speed an appearance of that polarity, an inverter is coupled between an input and an output terminal via a differentiating capacitor. The differentiated inverter output speeds the appearance of the switched output signal during the interval before the complementary input becomes effective thereat.

16 Claims, 6 Drawing Figures

LOW POWER CONSUMPTION HIGH SPEED TRANSISTOR CIRCUIT COMPRISING A COMPLEMENTARY CIRCUIT

The present invention relates to a transistor circuit which is operable at a high speed, with low power consumption, and which is suitable for use in a semiconductor integrated circuit.

A basic circuit in a semiconductor integrated circuit, which is operable with low power consumption, is a complementary metal-oxide-semiconductor field effect transistor (C-MOS) circuit. A P-channel type field effect transistor (hereinafter referred to as a "P-channel FET") and an N-channel type field effect transistor (hereinafter referred to as an "N-channel FET") are connected in series, as has been heretofore employed. A transistor circuit employing this C-MOS circuit, for example, has been known as a level shift circuit for converting a reference voltage or an output voltage height.

In the heretofore known level shift circuit, the aforementioned C-MOS circuit was provided in a paired, parallel relationship. The sources of the respective P-channel FET's were connected in common to a positive voltage source having a positive voltage $V_{DD}$. The sources of the respective N-channel FET's were connected in common to a negative voltage source having a negative voltage $V_{SS2}$. An input signal having a high level of the voltage $V_{DD}$ and a low level of a voltage $V_{SS1}$ was applied, through an input terminal, to the gate of the P-channel FET in the first C-MOS circuit. This input signal was simultaneously inverted through an inverter and was then applied to the gate of the P-channel FET in the second C-MOS circuit. The inverter was operated by positive and negative voltage sources having a positive voltage $V_{DD}$ and a negative voltage $V_{SS1}$, respectively. The common junctions of the drains in the respective C-MOS circuits were connected respectively to the gates of the N-channel FET's of the opposite C-MOS circuit. The common junction of the drains of the second C-MOS circuit provided an output terminal with an output signal having a lower level, shifted from the voltage $V_{SS1}$ to $V_{SS2}$.

In the operation of such a level shift circuit, for instance, if an input signal at the potential level of the voltage $V_{DD}$ is applied to the input terminal then the P-channel FET of the first C-MOS circuit becomes non-conductive and the P-channel FET in the second C-MOS circuit becomes conductive, responsive to the inverted output of the inverter. Accordingly, the respective N-channel FET's in the first and second C-MOS circuits are controlled between their conducting and non-conducting states, respectively. As a result, the positive potential level of the voltage $V_{DD}$ is delivered at the output terminal. Subsequently, when the potential level of the input signal changes to the potential level of the negative voltage $V_{SS1}$, an operation inverse to the aforementioned operation occurs. Hence, the level of the output signal is shifted to the potential level of the negative voltage $V_{SS2}$ which is obtained from the output terminal.

As described above, when the input signal changes from the positive potential level $V_{DD}$ to the negative potential level $V_{SS1}$, the P-channel FET in the first C-MOS circuit changes operating states from non-conducting to conducting. At this moment, the input signal is inverted by the inverter, and then applied to the gate of the P-channel FET in the second C-MOS circuit. After reaching a conductive state, the P-channel FET in the second C-MOS circuit is controlled by the inverted input signal. A signal at the drain of the P-channel FET in the second C-MOS circuit is applied to the gate of the N-channel FET in the first C-MOS circuit to change its state from conducting to non-conducting. However, the change in the operating state of the N-channel FET in the first C-MOS circuit is delayed after the change of the input signal. During this delay time, both the P-channel and N-channel FET's in the first C-MOS circuit become conductive state, resulting in a large through-flow current from the positive to the negative voltage sources through these two FET's, and in a resulting increase of power consumption. In addition, due to this delay time, a quick response could not be obtained. These large power consumption and slow response were enhanced by a stray capacitance associated with the gate capacitances of the N-channel FET's in the C-MOS circuit, and of the wiring capacitances. It is to be noted that if the input signal change is inverse to the aforementioned change, the above-described shortcomings would arise in the second C-MOS circuit. Therefore, it was difficult in the prior art to provide a high speed and low power, level shift shifting circuit.

Therefore, it is a principal object of the present invention to provide a transistor circuit which has low power consumption and is operable at a high frequency.

The transistor circuit according to the present invention comprises first and second variable impedance elements, input and output terminals and means for differentiating an input signal. The first variable impedance element has one end connected to a positive voltage source having a positive potential $V_{DD}$ and changes its impedance in response to an input signal. The second variable impedance element has one end connected to a negative potential source of a negative voltage $V_{SS2}$ and changes its impedance in response to the input signal. The change in impedance of the first impedance element is opposite to that of the second impedance element. Further, the other end of the first impedance is connected to the other end of the second impedance element. These first and second impedance elements are connected in series with each other and the other ends of the first and second impedance elements are connected to the output terminal. Means for differentiating the input signal are connected between the input and output terminals.

In the transistor circuit according to the present invention, one end of the serial connection of two variable impedance elements is connected to a positive voltage source $V_{DD}$ and the other end is connected to a negative voltage source $V_{SS2}$. An input signal is applied through an input terminal directly to the two variable impedance elements and to the differentiator circuit. Therefore, the impedances of the both variable impedance elements are simultaneously and directly controlled by the input signal, so that either one of the variable impedance elements quickly becomes non-conductive, resulting in a decrease of the current through the serial connection. Accordingly, power consumption can be greatly reduced, as compared to the heretofore known circuits. Furthermore, the differentiating means differentiates the input signal, which is superimposed upon the signal obtained at the output terminal by the operation of the series connection. Thus potential level at the output terminal can be immediately brought close to a desired potential level. Therefore, even if there is a delay in the rise or fall of the output signal at the output terminal responsive to the operation of the series connection, the delay time can be well compensated by the differentiated output from the differentiating means. An output signal can be obtained at a high speed responsive to the input signal can be obtained at a high speed.

The above-mentioned and other objects, features and advantages of the present invention will become more apparent from the following detailed description of preferred embodiments of the present invention taken in conjunction with the accompanying drawings, wherein.

Figure 1:
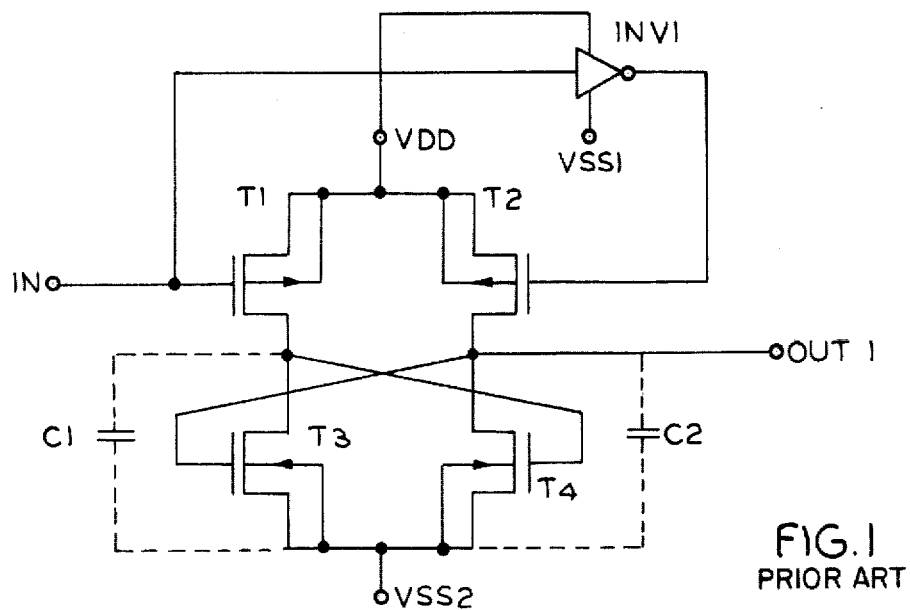
FIG. 1 is a circuit diagram showing a prior art level shift circuit.
Figure 2:
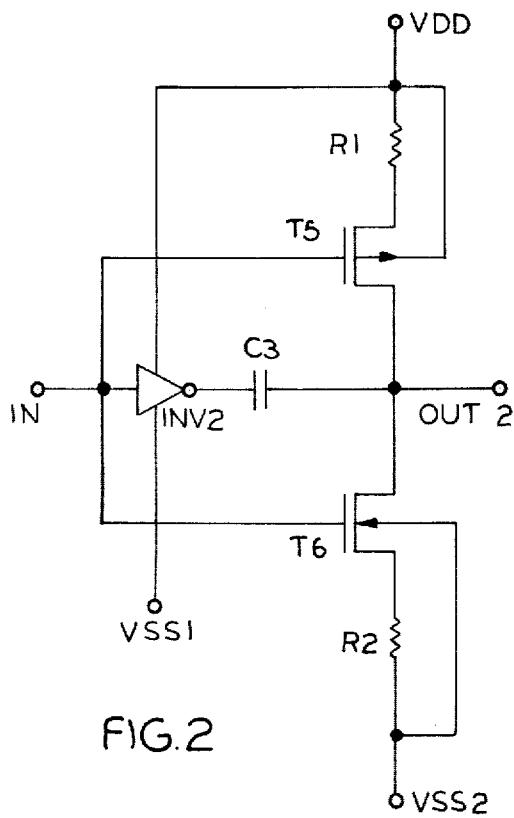
FIG. 2 is a circuit diagram showing one preferred embodiment of the present invention.
Figure 3:
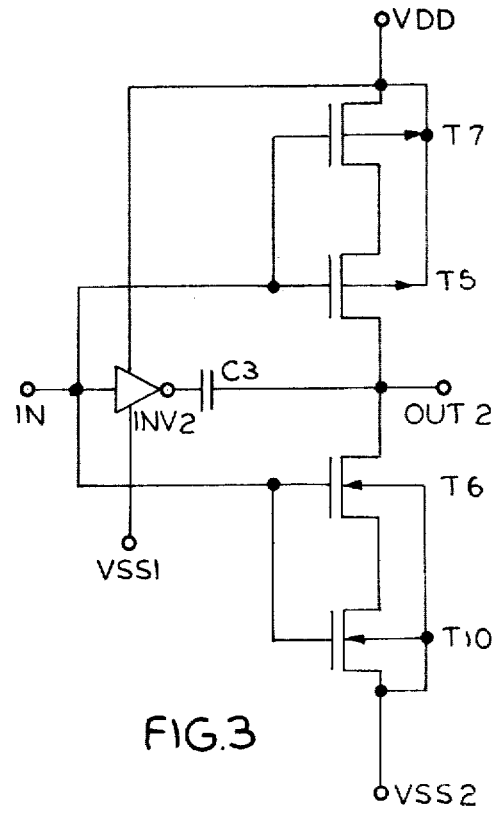
Figures 4, 5:
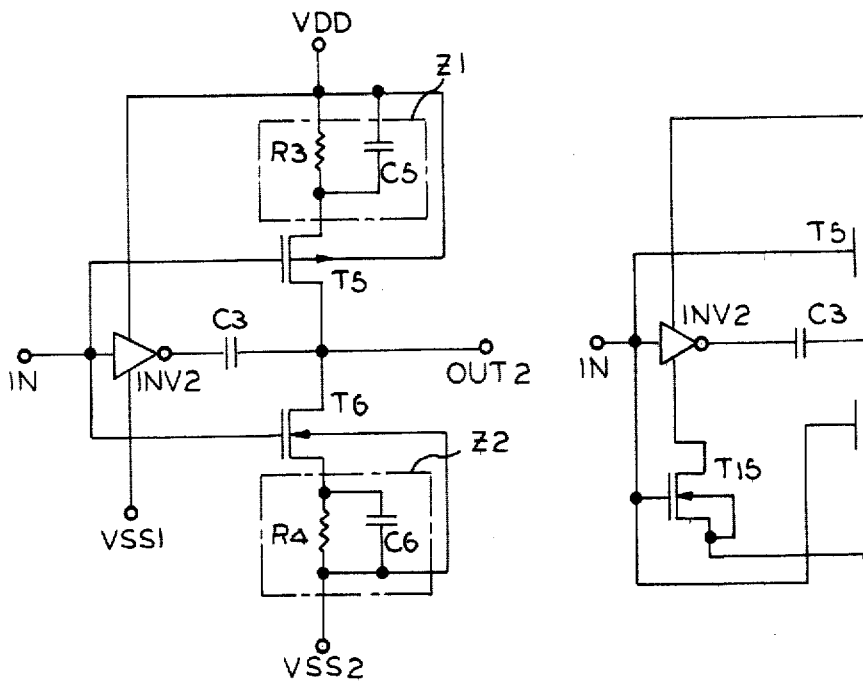

FIGS. 3, 4 and 5, respectively, are circuit diagrams showing alternative preferred embodiments of the present invention; and FIGS. 6(a) and 6(b) are timing charts for explaining the operations of the level shift circuits shown in FIGS. 1 and 2, respectively.

FIG. 1 shows a heretofore known transistor circuit as applied to a level shift circuit. A first complementary field effect transistor circuit, consists of a series connection of a P-channel FET $T_1$ and an N-channel FET $T_3$ and a second complementary field effect transistor circuit consists of a series connection of an P-channel FET $T_2$ and an N-channel FET $T_4$. A voltage source $V_{DD}$ for supplying a positive potential $V_{DD}$ is connected to the sources of both the P-channel FET's $T_1$ and $T_2$. The sources of both the N-channel FET's $T_3$ and $T_4$ are connected to a voltage source $V_{SS2}$, for supplying a negative potential $V_{SS2}$ to which the level of an input signal should be shifted.

The common drain junctions in the respective complementary field effect transistor circuits are connected to the gates of the N-channel FET's $T_3$ and $T_4$, respectively, of the opposite complementary field effect transistor circuits. An input signal having a higher level of the potential $V_{DD}$ and a lower level of the potential $V_{SS1}$ is applied through an input terminal IN directly to the gate of the P-channel FET $T_1$. However this input signal is not directly applied to the gate of N-channel FET $T_3$. Namely, this input signal is applied to the gate of the N-channel FET $T_3$ by way of the inverter INV1 and the P-channel FET2. The inverter INV1 is operated by the voltage source $V_{DD}$ of a positive potential and a negative potential from voltage source $V_{SS1}$. In more detail, after this input signal is inverted by the inverter INV1, the inverted signal of the input signal is applied to the gate of the P-channel FET $T_2$. Then, the P-channel FET $T_2$ is driven by the inverted signal to supply a signal produced at the drain of the P-channel FET $T_2$ in response to the inverted signal. The signal which is so produced is applied to the gate of the N-channel FET $T_3$. Consequently, a signal at the drain of the N-channel FET $T_3$ is applied to a gate of an N-channel FET $T_4$. An output signal level is determined by a potential level at a common drain junction of a C-MOS circuit constructed by the P-channel FET $T_2$ and the N-channel FET $T_4$.

The heretofore known level shift circuit shown in FIG. 1 basically employs the P-channel FET's T1 and T2 as active elements, and the N-channel FET's T3 and T4 as load elements. The load resistance obtained by the N-channel FET $T_4$ is controlled by a drain potential of the P-channel FET T1. A load resistance obtained by the N-channel FET $T_3$ is controlled by a drain potential of the P-channel FET $T_2$.

In the prior art level shift circuit shown in FIG. 1 an input signal with a low level of the potential Vss1, produces an output signal with a low level shifted to the potential Vss2. Namely, when a positive potential level $V_{DD}$ is applied to the input terminal IN, as an input signal, an output signal having the positive potential level $V_{DD}$ is derived from the output terminal $OUT_1$. When a first negative potential level Vss1 is applied to the input terminal IN, an output signal having a second negative potential level Vss2 is derived. Hence, the low level of an output signal is shifted from the first negative potential level Vss1 to the second negative potential level Vss2.

Next to be described is the operation of a prior art level shift circuit having the aforementioned circuit, as described with reference to FIG. 6(a). In this figure, waveform $I_1$ represents an input signal applied to the input terminal IN in FIG. 1, and waveform $O_1$ represents an output signal derived from the output terminal $OUT_1$ in FIG. 1.

If the potential of the input signal $I_1$, applied through the input terminal IN to the gate of the P-channel FET $T_1$, is at a positive potential level $V_{DD}$ (time period A in FIG. 6(a)), the potential applied to the gate of the P-channel FET $T_2$ is at a negative potential level Vss1, having been inverted by the inverter $INV_1$. Accordingly, the P-channel FET $T_2$ becomes conductive, and a potential level of the output signal $O_1$ appearing at the output terminal $OUT_1$ takes a positive potential level $V_{DD}$.

On the other hand, if the potential of the input signal $I_1$ is at a first negative potential level Vss1 (time period B in FIG. 6(a)), the P-channel FET $T_1$ becomes conductive and the P-channel FET $T_2$ becomes non-conductive after a delay of duration $t_1$. Thereby the N-channel FET's $T_3$ and $T_4$ become conducting and non-conducting, respectively, so that an output signal $O_1$ having a second negative potential level Vss2 is fed to the output terminal $OUT_1$. Consequently, the input signal $I_1$ having a low level of the first negative potential level Vss1 can be shifted in level to the output signal $O_1$ having a low level of the second negative potential level Vss2.

However, the level shift circuit in FIG. 1, which can effect the above-described level shift operation, requires time to make the shift to the following state, as indicated by the durations $t_1$ and $t_2$.

At first, when the potential level of the input signal $I_1$ is a positive potential level $V_{DD}$, the P-channel FET $T_1$ and the N-channel FET $T_4$ are non-conductive, whereas the P-channel FET $T_2$ and the N-channel FET $T_3$ are conducting. Subsequently, when the potential level of the input signal $I_1$ changes to the low level of the first negative potential $V_{ss1}$, the potential applied to the gate of the P-channel FET $T_2$ takes a positive potential level $V_{DD}$, after some delay. The P-channel FET's $T_1$ and $T_2$ become conductive and non-conductive, respectively. However, the transitions of the conductive state of the N-channel FET's $T_3$ and $T_4$ would not occur immediately upon this change in potential level of the input signal $I_1$. The delay is due to electric charges stored in the stray capacitances $C_1$ and $C_2$, as illustrated in FIG. 1, by dashed lines between the respective sources and drains of the N-channel FET's $T_3$ and $T_4$. Thus, the change of conductivity cannot occur simultaneously with the transitions of the P-channel FET's $T_1$ and $T_2$, but would hold the previous states for a while.

Particularly, even when the P-channel FET $T_1$ has changed to conducting in response to the input signal $I_1$, the N-channel FET $T_3$ would maintain its previous conductive state for a while, due to the stray capacitance $C_1$. Then, after the drain potential of the P-channel FET $T_2$ has risen to the positive potential $V_{DD}$, upon completion of the charging of the stray capacitance $C_1$, the N-channel FET $T_4$ becomes conducting, and the drain potential of the P-channel FET $T_2$ takes the second negative potential Vss2.

Figure 6:
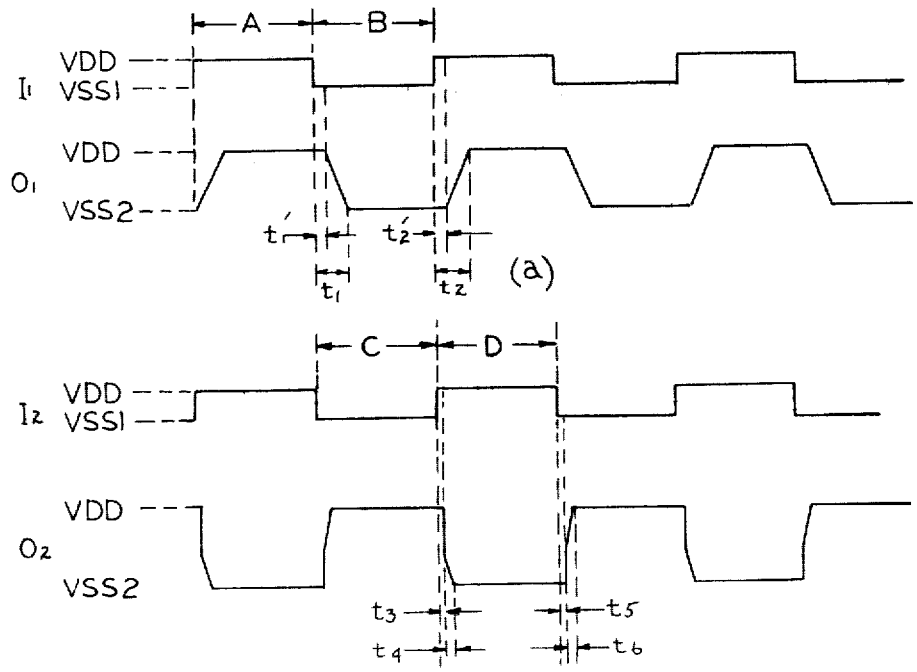

This transient period is the period indicated by $t_1$ in FIG. 6($a$). During this period $t_1$, a conducting path is temporarily formed between the positive and negative voltage sources, through the P-channel FET $T_1$ and the N-channel FET $T_3$. A through-flow current flows through the conducting path and the power consumption of the transistor circuit is increased.

If the input signal applied to the input terminal IN is subjected to an inverse change (i.e., from the potential level Vss1 to the potential level $V_{DD}$), then the through-flow current flows between the positive and negative voltage sources $V_{DD}$ and $V_{SS2}$, through the P-channel FET $T_2$ and the N-channel FET $T_4$, during the period $t_2$ shown in FIG. 6($a$).

Accordingly, if the cycles of the input signal are shortened, then the period when the through-flow current flows is increased results in a remarkable increase of power consumption. Especially in an integrated semiconductor circuit for high frequency low power consumption use, such type of level shift circuits could not be used in the prior art.

Further, an input signal $I_1$ is not directly applied to the gate of the N-channel FET $T_3$, but is applied through the inverter $INV_1$ to the gate of the P-channel FET $T_2$. Then, a signal obtained at the drain of the P-channel FET $T_2$ is applied to the gate of the N-channel FET $T_3$. Namely, the input signal $I_1$ cannot directly control the N-channel FET $T_3$, so that a control of the N-channel FET $T_3$ can not make quickly. Consequently, the FET $T_3$ does not change its conductivity in response to change in the input signal until the drain potential of the FET $T_2$ changes. This time delay is shown in FIG. 6($a$) by $t_1'$ and $T_2'$. In such the level shift circuit, a potential level of an output signal is not made simultaneously with a change of the input signal in the prior level shift circuit; therefore, a high speed level shift operation can not obtain.

One preferred embodiment of a transistor circuit according to the present invention is shown in FIG. 2. The following description is in the case of the transistor circuit applied to a level shift circuit.

The level shift circuit shown in the FIG. 2 has a P-channel FET $T_5$ and an N-channel FET $T_6$ which are connected in series. A source of the P-channel FET $T_5$ is connected through a resistor $R_1$ of, for example, 100 K Ω, to a positive voltage source of the potential level $V_{DD}$. A source of N-channel FET $T_6$ is connected through a resistor $R_2$ of, for example 100 K Ω, to a negative voltage source of a negative potential level Vss2. Furthermore, to a junction between the drains of the P-channel FET $T_5$ and the N-channel FET $T_6$ is connected one end of a capacitor $C_3$, the other end of which is connected to an output end of an inverter $INV_2$. To a positive potential supply terminal of the inverter $INV_2$ is fed the positive potential $V_{DD}$, while to a negative potential supply terminal thereof is fed a negative potential Vss1 which could be a negative potential applied to the circuit in the preceding stage, or else any predetermined negative potential.

Hereinafter, the negative potential Vss1 is referred to a first negative potential Vss1 and the negative potential Vss2 is referred to a second negative potential. This first negative potential Vss1 is preset so that it is smaller, in absolute value, than the second negative potential Vss2. The input terminal IN, to which the input signal is applied, is connected in common to the input end of the inverter $INV_2$ as well as the gates of the P-channel FET $T_5$ and the N-channel FET $T_6$. The common junction between the drains of the P-channel FET $T_5$ and the N-channel FET $T_6$ is connected to an output terminal $OUT_2$. The capacitance of the capacitor $C_3$ is preferably designed to have 5 pF or more. Though this capacitance is appropriately selected, depending upon the load impedances and the saturated resistances of the FET's, a capacitance suitable for assembling in a semiconductor integrated circuit is, at the largest, about 50 pF.

In this embodiment of the level shift circuit, the P-channel FET $T_5$ and the N-channel FET $T_6$ constitute a C-MOS circuit. The inverter $INV_2$ and the capacitor $C_3$ constitute a differentiator circuit.

A principal operation of the level shift circuit is to deliver two kinds of output levels from the output terminal $OUT_2$ in response to an input signal. One output level is of the positive potential $V_{DD}$ and the other output level is of the second negative potential Vss2. Namely, when an input signal of a positive potential $V_{DD}$ is applied to the input terminal IN, the N-channel FET $T_6$ becomes conducting, so that an output signal with the second negative potential Vss2 is derived at the output terminal $OUT_2$. On the other hand, when an input signal of a first negative potential Vss1 is applied to the input terminal IN, the P-channel FET $T_5$ becomes conductive, so that an output signal of the positive potential $V_{DD}$ is derived at the output terminal $OUT_2$. In this case, the positive level input signal is shifted to the second negative level output signal and the first negative level input signal is shifted to the positive level output signal.

A characteristic effect of the above-mentioned level shift circuit will appear for a short period of time when one potential level of an input signal changes to another potential level. This will be described more in detail with reference to FIG. 6($b$).

At first, when an input signal changes from the first negative potential level Vss1 to the positive potential level $V_{DD}$, the P-channel FET $T_5$ changes to a non-conducting state, and at the same time the N-channel FET $T_6$ changes to conducting state. As a result, the second negative potential Vss2 appears at the output terminal $OUT_2$ (during the period D in FIG. 6($b$)). However, at this moment the input signal $I_2$ applied to the inverter $INV_2$ is quickly inverted by the inverter $INV_2$. The inverted signal is differentiated by the subsequent capacitor $C_3$. The differentiated negative-going signal abruptly brings the output terminal $OUT_2$ close to the first negative potential Vss1. This period is very short, as indicated by the duration $t_3$ in FIG. 6($b$). Successively, the potential at the output terminal $OUT_2$ can be gradually brought close to the desired negative potential Vss2 (during the period $t_4$ in FIG. 6($b$)). As a result, the total delay period is shortened to the sum of the periods $t_3$ and $t_4$. A high speed level shift operation becomes possible. Since the sum of the periods $t_3$ and $t_4$ is far shorter than the period $t_1$ or $t_2$ in FIG. 6($a$), the time period in which the through-flow current flows through the P-channel and N-channel FET's $T_5$ and $T_6$ is minimized. Thus, the power consumption can be greatly reduced during such a transient period.

Since the input signal is applied directly to both the gates of the P-channel FET $T_5$ and the N-channel FET $T_6$, the changes in the conductive states of the complementary FET's $T_5$ and $T_6$ can be achieved at a higher speed as compared to the heretofore known speed of the level shift circuit, such as the circuit shown in FIG. 1. Therefore, the duration when the through-flow current flows through the FET's $T_5$ and $T_6$ can be further reduced. Moreover, during the transient period occurring upon a variation of the input signal level, the gate potentials of the respective FET's $T_5$ and $T_6$ change continuously, and so, inevitably a through-flow current is passed through the both FET's. However, according to the above-described embodiment, the resistors $R_1$ and $R_2$ are connected between the voltage sources $V_{DD}$, $V_{SS2}$ in series with the P-channel and N-channel FET's $T_5$ and $T_6$. Thus, the magnitude of the through-flow current flowing between the voltage sources can be made very small. Therefore, this level shift circuit is effective for reducing power consumption.

Subsequently, when the input signal applied to the input terminal IN is varied from the higher level to a lower level, the P-channel FET $T_5$ becomes conductive, while the N-channel FET $T_6$ becomes non-conductive. At the same time, the output of the inverter $INV_2$ takes the potential $V_{DD}$ corresponding to the higher level. Thus, the potential at the output terminal $OUT_2$ is quickly brought close to the potential $V_{DD}$ owing to the differentiation effect of the capacitor $C_3$. This period is very short, as indicated by the duration $t_5+t_6$ in FIG. 6(b). Since a delay in the rise of the output signal $O_2$ is very short, and also since the N-channel FET $T_6$ becomes non-conductive almost simultaneously with the variation of the input signal level, the magnitude of the through-flow current flowing between the positive and negative voltage sources $V_{DD}$ and $V_{SS2}$ is small. It is further suppressed by the resistors $R_1$ and $R_2$, so that the power consumption can be reduced. More particularly, when an FET is switched from its conducting to its non-conducting state, it remains conductive for a while due to its gate capacitance. Since the threshold voltages of the respective FET's are raised by the resistors $R_1$ and $R_2$, the value of the through-flow current flowing between the voltage sources is limited to a small value, and thereby the power consumption can be reduced.

According to the above-described embodiment of the present invention, a current flowing between two voltage sources is limited by inserting impedances between the power supply terminals and the sources of field effect transistors, because of equivalently high threshold voltages of the field effect transistors. Further, a rise and fall of an output signal $O_2$ are quickened by applying a differentiated signal from the differentiator circuit, whereby an advantage is provided that a through-flow current between voltage sources can be reduced and also a frequency response can be improved.

In the aforementioned level shift circuit of the present invention, an input signal with the positive potential is shifted to the second negative potential and an input signal with the first potential is shifted to the positive potential. Namely, the phase of an output signal is opposite to the phase of an input signal. However, if only an inverter circuit is added before the input terminal IN or after the output terminal $OUT_2$, an output signal having the same phase as that of the input signal can be obtained. Further, the channel typer of the FET's $T_5$ and $T_6$ may be exchanged with each other as an N-channel type FET $T_5'$ and a P-channel type FET $T_6'$, respectively. In this modification, a second gate or a substrate gate of the N-channel type FET $T_5'$ should be connected to the second negative voltage source $V_{SS2}$ and that of the P-channel type FET $T_6'$ should be connected to the positive voltage source $V_{DD}$. According to such a modified level shift circuit, an output signal having no-phase conversion is obtained. However, a resistor or non-conducting amplifier should be employed in place of the inverter $INV_2$. In such level shift circuits, the effects of the present invention can be enough achieved.

The present invention is not limited to the aforementioned preferred embodiment, but it could be practiced in various modes. For instance, while the resistors $R_1$ and $R_2$ were described as impedance elements in the first preferred embodiment in FIG. 2, active elements may also be used. For example, a P-channel FET $T_7$ and an N-channel FET $T_{10}$ have resistances which vary depending upon their input potentials, and they could be used in place of the resistors $R_1$ and $R_3$, as shown in FIG. 3. In this modified embodiment, the resistance value of the N-channel FET $T_{10}$ should be set at a high value. There is an advantage since the through-flow current can be suppressed and the rise of the output signal $O_2$ can be quickened.

Alternatively, as shown in FIG. 4, an impedance $Z_1$ (consisting of a resistor $R_3$ and a parallel capacitor $C_5$) and an impedance $Z_2$ (consisting of a parallel connection of a resistor $R_4$ and a capacitor $C_6$) may be used in place of the resistors $R_1$ and $R_2$, respectively, in the first embodiment shown in FIG. 2. In this modification, when the output potential at the output terminal varies, it can vary more quickly to arrive at the potential of the either voltage source, due to the capacitors $C_5$ and $C_6$. Therefore, the rise and fall of the output signal can be quickened.

Furthermore, as shown in FIG. 5, by inserting an N-channel FET $T_{15}$ between a negative voltage source terminal of an inverter $INV_2$ and a second negative voltage source $V_{SS2}$. The $FET_{15}$ brings the potential of the negative voltage source, for the inverter $INV_2$, close to a potential $V_{DD}$ if an input signal potential $V_{SS1}$ is applied to an input terminal IN. The potential of the negative voltage source is brought close to a potential $V_{SS1}$ if the potential of the input signal is the potential $V_{DD}$. At the same time, the variation of the level at the output terminal $OUT_2$ (upon variation of the input signal) can be made large and the rise and fall in potential at the output terminal $OUT_2$ can be quickened.

Besides, for the load impedances, active loads can be employed such as constant current sources in which a field effect transistor is connected to form a constant current source.

The transistor circuit according to the present invention is applicable to semiconductor integrated circuits for high speed pulse use and for low power consumption use, and even when it is applied to a level shift circuit such as described in connection with the illustrated embodiments. A sufficiently high speed as well as a sufficiently low power consumption can be realized.

In addition, if the supply potential of the first negative voltage source $V_{SS1}$ and the supply potential of the second negative voltage source $V_{SS2}$ are set at the same negative potential, the circuit can be used for various transistor circuits such as a waveform shaper circuit or an inverter circuit for an input signal, a signal detector circuit or the like, and obviously, in all these transistor circuits, a high speed processing as well as a low power consumption can be achieved equally well.

What is claimed is:

1. A transistor circuit comprising:
   a. a first variable impedance element for changing its impedance in response to an input signal;
   b. a second variable impedance element for changing its impedance in response to said input signal, said second variable impedance element being connected in series to said first variable impedance element, the change in impedance of said second variable impedance element being opposed to the change in impedance of said first variable impedance element with respect to said input signal;
   c. an input terminal for receiving said input signal, said input terminal being coupled to said first and second variable impedance elements to vary their impedances;
   d. an output terminal deriving an output signal in response to said input signal, said output terminal being connected to means for coupling both said first and second variable impedance elements; and
   e. means coupled between said input and output terminals for differentiating said input signal.

2. A transistor circuit as set forth in claim 1, in which said differentiating means includes an inverter circuit and a first capacitance, said inverter circuit being connected in series with said capacitance.

3. A transistor circuit as set forth in claim 1, in which said first variable impedance element includes a first transistor element of one conductivity and a first resistor, and said second variable impedance element includes a second transistor element of another conductivity which is different from said one conductivity and a second resistor.

4. A transistor circuit as set forth in claim 1, in which said first variable impedance element includes a plurality of first transistors connected in series, each of said first transistors having an input electrode and being of one conductivity type, each input electrode of said first transistors being connected to said input terminal, and said second variable impedance element includes a plurality of second transistors connected in series, each of said second transistors having an input electrode and, each input electrode of said second transistors being connected to said input terminal.

5. A transistor circuit as set forth in claim 3, further comprising a first capacitance connected in parallel with said first resistor, and a second capacitance connected in parallel with said second resistor.

6. A transistor circuit as set forth in claim 1, in which said inverter has first and second voltage supply ends, said first voltage supply end being supplied with a first voltage and said second voltage supply end being connected to an output electrode of a third transistor which has a common electrode receiving a second voltage and an input electrode connected to said input terminal.

7. A transistor circuit as set forth in claim 1, in which said differentiating means includes an inverter circuit in series with a first capacitance, said first variable impedance element includes a first transistor element of one conductivity and a first resistor, said second variable impedance element includes a second transistor element of an opposite conductivity and a second resistor, a second capacitance connected in parallel with said first resistor, and a third capacitance connected in parallel with said second resistor.

8. A transistor circuit as set forth in claim 1, in which said differentiating means includes an inverter circuit connected in series with a first capacitance, said first variable impedance element includes a first transistor element of one conductivity and a first resistor, said second variable impedance element includes a second transistor element of and opposite conductivity and a second resistor, said inverter having first and second voltage terminals, said first voltage terminal being supplied with a first voltage and said second voltage terminal being connected to an output electrode of a third transistor which has a common electrode for receiving a second voltage and an input electrode connected to said input terminal.

9. A low-power consumption, high-speed, electronic voltage level switching system comprising a pair of variable impedance complementary switching means having control electrodes connected to a common input terminal, whereby said complementary circuit switches an output terminal back and forth between two conductive states responsive to changes in polarity of input signals appearing at said input terminal, first means for differentiating said input signals, and second means for applying the output of said first means to said output terminal.

10. The system of claim 9 wherein said pair of variable impedance means are connected between said output terminal and opposite terminals of a power source, and inverter means is coupled between said input terminal and said first means.

11. The system of claim 10 wherein said differentiation means is a capacitor coupled in series with the output of said inverter means.

12. The system of claim 10 wherein said variable impedance comprises a resistor and a transistor connected in series.

13. The system of claim 10 wherein said variable impedance comprises a plurality of transistors of one conductive type connected in series between a first terminal of said power source and said output terminal, and a plurality of transistors of the opposite conductive type connected in series between a second terminal of said power source and said output terminal.

14. The system of claim 10 wherein said variable impedance comprises a parallel circuit including a resistance and a capacitance coupled in series with a transistor.

15. The system of claim 10 wherein said variable impedance comprises a transistor coupled between a side of said complementary switching means which is of its conductive type and an input terminal.

16. A method of switching an output terminal of an integrated semiconductor current between two opposite polarities, said method comprising the steps of:
   a. driving a complementary circuit responsive to input pulses of opposite potentials, whereby one side of said complementary circuit is conductive and the other side is non-conductive at the same time;
   b. driving an inverter responsive to said input pulse; and
   c. applying an output of said inverter via a capacitive coupling means to said output terminal thereby speeding an appearance of the polarity of the output of said inverter at said output terminal.

* * * * *